US011881826B2

(12) United States Patent
Singleton et al.

(10) Patent No.: US 11,881,826 B2
(45) Date of Patent: Jan. 23, 2024

(54) AUDIO AMPLIFIER CIRCUITRY

(71) Applicant: Cirrus Logic International Semiconductor Ltd., Edinburgh (GB)

(72) Inventors: David P. Singleton, Edinburgh (GB); Andrew J. Howlett, Edinburgh (GB); John B. Bowlerwell, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 76 days.

(21) Appl. No.: 17/142,904

(22) Filed: Jan. 6, 2021

(65) Prior Publication Data

US 2021/0242847 A1 Aug. 5, 2021

Related U.S. Application Data

(60) Provisional application No. 62/968,261, filed on Jan. 31, 2020.

(30) Foreign Application Priority Data

Feb. 24, 2020 (GB) ..................................... 2002541

(51) Int. Cl.
*H03F 3/45* (2006.01)

(52) U.S. Cl.
CPC ..... *H03F 3/45659* (2013.01); *H03F 3/45179* (2013.01); *H03F 3/45645* (2013.01);
(Continued)

(58) Field of Classification Search
CPC ............. H03F 3/45659; H03F 3/45179; H03F 3/45645; H03F 2200/03; H03F 2203/45084; H03F 2203/45402; H03F 2203/45592; H03F 1/305; H03F 3/187; H03F 3/45475; H03F 3/183; H04R 3/007; H04R 3/00
(Continued)

(56) References Cited

U.S. PATENT DOCUMENTS

| 5,245,665 A | * | 9/1993 | Lewis | ...................... H04R 3/02 381/93 |
| 8,965,010 B2 | * | 2/2015 | Sorace | .................. H03F 3/3022 381/120 |

(Continued)

FOREIGN PATENT DOCUMENTS

| EP | 2317644 A1 | 5/2011 |
| EP | 2375566 A1 | 10/2011 |

(Continued)

OTHER PUBLICATIONS

Examination Report under Section 17, UKIPO, Application No. GB2002541.7, dated Jun. 3, 2021.
(Continued)

*Primary Examiner* — Andrea Lindgren Baltzell
*Assistant Examiner* — Khiem D Nguyen
(74) *Attorney, Agent, or Firm* — Jackson Walker L.L.P

(57) ABSTRACT

The present disclosure relates to circuitry comprising audio amplifier circuitry for receiving an audio signal to be amplified; and first and second output nodes for outputting first and second differential output signals. The circuitry further comprises common mode buffer circuitry configured to receive a common mode voltage and to selectively output the common mode voltage to the first and second output nodes.

22 Claims, 9 Drawing Sheets

(52) U.S. Cl.
    CPC .................. *H03F 2200/03* (2013.01); *H03F 2203/45084* (2013.01); *H03F 2203/45402* (2013.01); *H03F 2203/45592* (2013.01)

(58) Field of Classification Search
    USPC .......................................... 330/10, 251, 258
    See application file for complete search history.

(56) References Cited

U.S. PATENT DOCUMENTS

| | | |
|---|---|---|
| 10,236,832 B1 | 3/2019 | Jheng et al. |
| 10,819,291 B2 | 10/2020 | Wang et al. |
| 2006/0159292 A1* | 7/2006 | Guilbert .............. H03F 3/45475 381/123 |
| 2017/0033744 A1 | 2/2017 | Yang et al. |
| 2017/0350923 A1* | 12/2017 | Mostert ................... H04R 3/00 |

FOREIGN PATENT DOCUMENTS

| | | |
|---|---|---|
| EP | 3579576 A1 | 12/2019 |
| GB | 2591825 A | 8/2021 |
| WO | 2017034727 A1 | 3/2017 |
| WO | 2019196065 A1 | 10/2019 |

OTHER PUBLICATIONS

Combined Search and Examination Report under Sections 17 and 18(3), UKIPO, Application No. GB2002541.7, dated Aug. 18, 2020.
Combined Search and Examination Report under Sections 17 and 18(3), UKIPO, Application No. GB2109355.4, dated Dec. 22, 2021.

* cited by examiner

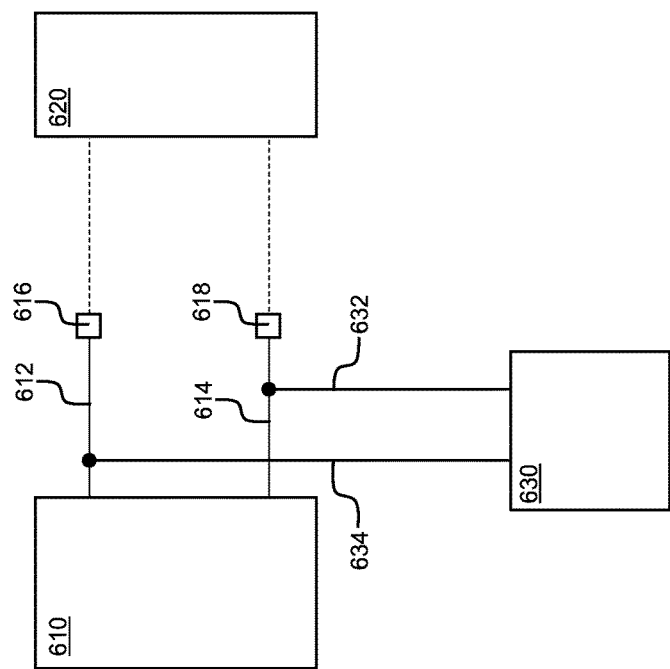

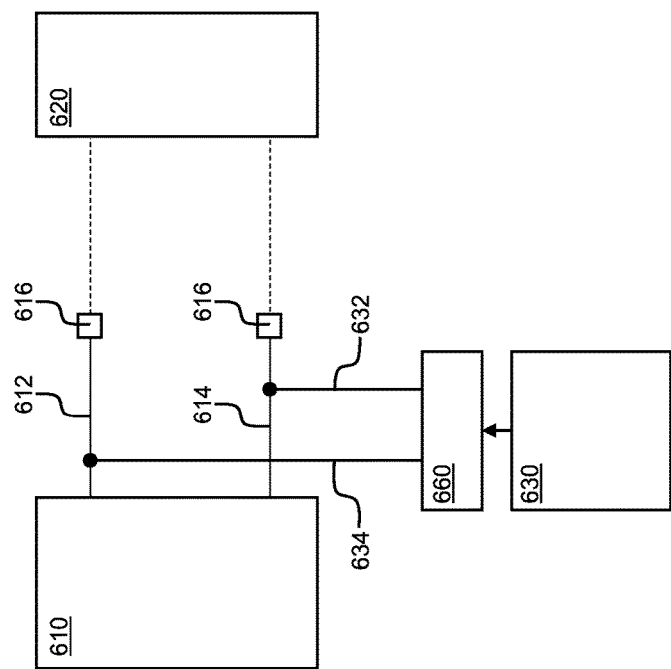

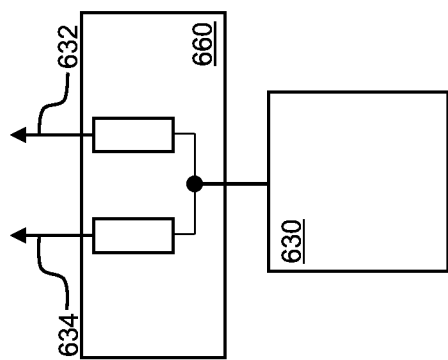
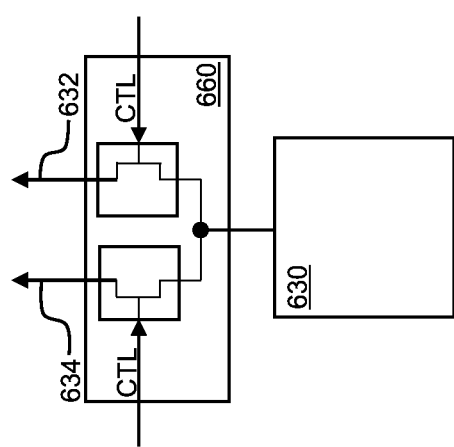
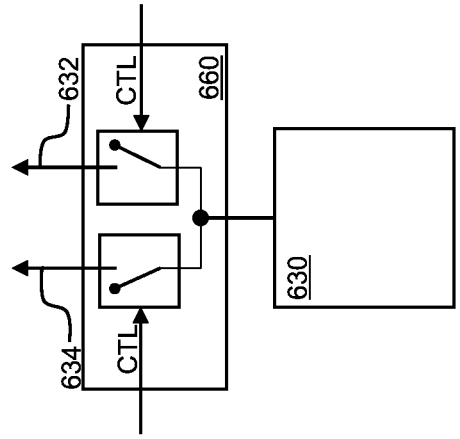

AUDIO AMPLIFIER CIRCUITRY

CROSS-REFERENCE TO RELATED APPLICATIONS

This application is claims priority to U.S. Provisional Patent Application Ser. No. 62/968,261, filed Jan. 31, 2020, and United Kingdom Patent Application No. 2002541.7, filed Feb. 24, 2020, each of which is incorporated by reference herein in its entirety.

FIELD OF THE INVENTION

The present disclosure relates to the field of audio amplifier circuitry.

BACKGROUND

In some audio applications an audio load (e.g. an audio output transducer) of a host audio device such as a headphone, earphone, earbud or the like is driven by a differential signal output by amplifier circuitry. Thus the amplifier circuitry has two output nodes for outputting the differential signal, and the audio load is coupled between the two output nodes.

In some cases the amplifier circuitry receives a supply voltage from positive and negative power supplies. However, in some cases a negative power supply is not available, and thus the amplifier circuitry receives a power supply voltage from a positive power supply and a reference power supply which is typically ground or 0 volts. In such circumstances the amplifier circuitry must generate the differential output signal by generating output signal portions that are referenced to a common mode voltage at a level intermediate the available positive supply voltage and the reference power supply voltage. For example, if the amplifier circuitry receives a positive power supply voltage of 1.8 volts and a reference voltage of 0 volts, then a common mode voltage of 0.9 volts may be selected.

On start-up of the amplifier circuitry a voltage at the output nodes must transition from 0 volts to the common mode voltage. Similarly, when the amplifier circuitry shuts down, the voltage at the output nodes transitions from the common mode voltage to 0 volts. These transitions at the output nodes can give rise to audible artefacts such as popping sounds output by the audio load, which can have a negative effect on the user's experience of using the host audio device.

SUMMARY

According to a first aspect, the invention provides circuitry comprising:
audio amplifier circuitry for receiving an audio signal to be amplified; and
first and second output nodes for outputting first and second differential output signals,
wherein the circuitry further comprises common mode buffer circuitry configured to receive a common mode voltage and to selectively output the common mode voltage to the first and second output nodes.

The audio amplifier circuitry may further comprise first and second power supply input nodes for receiving a positive power supply voltage and a reference power supply voltage.

The reference power supply voltage may be ground.

The circuitry may further comprise low pass filter circuitry having an input that is configured to receive the common mode voltage and an output coupled to an input of the common mode buffer circuitry.

The circuitry may further comprise a low pass filter discharge switch coupled in parallel with a capacitance of the low pass filter circuitry, the low pass filter discharge switch being operable to discharge the capacitance.

The circuitry may further comprise digital to analogue converter (DAC) circuitry.

The audio amplifier circuitry may comprise combined amplifier and DAC circuitry.

The circuitry may further comprise first and second common mode clamp switches coupled between an output of the common mode buffer unit and the first and second output nodes respectively, to selectively couple the first and second output nodes to the output of the common mode buffer.

The circuitry may further comprise first and second clamp switches coupled to the first and second output nodes respectively, to selectively couple the first and second output nodes to a reference voltage.

The reference voltage may be ground.

The circuitry may further comprise an output clamp switch coupled to the first and second output nodes, to selectively couple the first and second output nodes to each other.

The amplifier circuitry may comprise:
a dummy output stage;
a dummy feedback path for selectively coupling an output of the dummy output stage to an input of the amplifier unit;
a real output stage; and
a real feedback path for selectively coupling an output of the real output stage to the input of the amplifier unit.

The dummy feedback path may be configured to couple the output of the dummy output stage to the input of the amplifier unit during start-up of the amplifier unit to bias the amplifier unit.

The real feedback path may comprise a switched capacitor network.

The amplifier circuitry may comprise differential amplifier circuitry.

Alternatively, the amplifier circuitry may comprises first and second pseudo-differential amplifiers.

The circuitry may further comprise:
a first dummy output stage that is selectively couplable to first and second differential outputs of the first pseudo-differential amplifier;
a first real output stage that is selectively couplable to the first and second differential outputs of the first pseudo-differential amplifier;
a first dummy feedback path for selectively coupling an output of the first dummy output stage to an input of the first pseudo-differential amplifier;
a first real feedback path for selectively coupling an output of the first real output stage to an input of the first pseudo-differential amplifier;
a second dummy output stage that is selectively couplable to first and second differential outputs of the second pseudo-differential amplifier;
a second real output stage that is selectively couplable to the first and second differential outputs of the second pseudo-differential amplifier;
a second dummy feedback path for selectively coupling an output of the second dummy output stage to an input of the second pseudo-differential amplifier; and a second real feedback path for selectively coupling an output of the second real output stage to an input of the second pseudo-differential amplifier.

The circuitry may further comprise:
a first compensation capacitance coupled to the first pseudo-differential amplifier, wherein the first compensation capacitance is selectively couplable to the first dummy feedback path or to the first real feedback path; and
a second compensation capacitance coupled to the second pseudo-differential amplifier, wherein the second compensation capacitance is selectively couplable to the second dummy feedback path or to the second real feedback path.

The circuitry may be configured such that during start-up or shut-down of the amplifier circuitry:
the first dummy output stage is coupled to the first and second differential outputs of the first pseudo-differential amplifier;
the first dummy feedback path couples the output of the first dummy output stage to the input of the first pseudo-differential amplifier so as to bias the first pseudo-differential amplifier;
the second dummy output stage is coupled to the first and second differential outputs of the second pseudo-differential amplifier;
the second dummy feedback path couples the output of the second dummy output stage to the input of the second differential amplifier so as to bias the second pseudo-differential amplifier; and
an output of the common mode buffer circuitry is coupled to the first and second output nodes such that the first and second output nodes receive the common mode voltage.

The circuitry may be configured such that during normal operation of the amplifier circuitry:
the first real output stage is coupled to the first and second differential outputs of the first pseudo-differential amplifier;
the first real feedback path couples the output of the first real output stage to the input of the first pseudo-differential amplifier;
the second real output stage is coupled to the first and second differential outputs of the second pseudo-differential amplifier;
the second real feedback path couples the output of the second real output stage to the input of the second pseudo-differential amplifier; and
an output of the common mode buffer circuitry is decoupled from the first and second output nodes.

The circuitry may be configured such that during a mute state in which no input signal is present at the input node, an output of the common mode buffer circuitry is coupled to the first and second output nodes such that the first and second output nodes receive the common mode voltage.

According to a second aspect, the invention provides amplifier circuitry for receiving a signal to be amplified, the amplifier circuitry comprising:
first and second output nodes for outputting first and second differential output signals;
a dummy output stage;
a dummy feedback path for selectively coupling an output of the dummy output stage to an input of the amplifier circuitry;
a real output stage; and
a real feedback path for selectively coupling an output of the real output stage to the input of the amplifier circuitry.

According to a third aspect, the invention provides circuitry comprising:
first signal processing circuitry comprising first and second output signal paths for outputting a differential output signal; and
second circuitry configured to output a common mode voltage to said first and second output signal paths.

The circuitry may further comprise:
a first resistance in a first signal path between the second circuitry and the first output signal path;
a second resistance in a second signal path between the second circuitry and the second output signal path.

The circuitry may further comprise:
selector circuitry in a signal path between the second circuitry and the first and second output signal paths.

The circuitry may further comprise:
a first controllable switching device coupled between an output of the second circuitry and the first output signal path so as to selectively couple the output of the second circuitry to the first output signal path; and
a second controllable switching device coupled between an output of the second circuitry and the second output signal path so as to selectively couple the output of the second circuitry to the second output signal path.

The circuitry may further comprise:
a first transistor device coupled between an output of the second circuitry and the first output signal path so as to selectively couple the output of the second circuitry to the first output signal path; and
a second transistor coupled between an output of the second circuitry and the second output signal path so as to selectively couple the output of the second circuitry to the second output signal path.

The circuitry may further comprise:
a first resistance coupled between an output of the second circuitry and the first output signal path so as to selectively couple the output of the second circuitry to the first output signal path; and
a second resistance coupled between an output of the second circuitry and the second output signal path so as to selectively couple the output of the second circuitry to the second output signal path.

The first signal processor circuitry may comprise amplifier circuitry or DAC circuitry.

The second circuitry may comprise amplifier or buffer circuitry.

According to a fourth aspect, the invention provides circuitry comprising:
first signal processing circuitry comprising first and second output signal paths for outputting a differential output signal; and
second signal processing circuitry configured to selectively output a common mode voltage to said first and second output signal paths.

According to a fifth aspect, the invention provides circuitry comprising:
a differential amplifier comprising first and second output signal paths for outputting a differential output signal; and
a buffer amplifier configured to output a common mode voltage to said first and second output signal paths.

According to a sixth aspect, the invention provides circuitry comprising:

a differential amplifier comprising first and second output signal paths for outputting a differential output signal to a load; and a buffer amplifier configured to output a common mode voltage to said first and second output signal paths.

The circuitry of the fourth, fifth or sixth aspects may further comprise the additional features recited above in relation to the first and/or third aspects.

According to a seventh aspect, the invention provides integrated circuitry comprising the circuitry of any one of the first to sixth aspects.

According to an eighth aspect, the invention provides a device comprising the circuitry of any one of the first to sixth aspects.

The device may comprise a mobile telephone, a tablet or laptop computer, a smart speaker, an accessory device, headphones, earphones or earbuds.

BRIEF DESCRIPTION OF THE DRAWINGS

Embodiments of the invention will now be described, strictly by way of example only, with reference to the accompanying drawings, of which:

FIG. 2b is a schematic diagram illustrating parasitic capacitances that may be present in the circuitry of FIG. 2a;

FIGS. 5a, 5b, and 5c are schematic representations of circuitry comprising first signal processing circuitry and second circuitry configured to output a common mode voltage; and FIGS. 5d, 5e, and 5f are schematic representations of selector circuitry that may be used in the circuitry of FIG. 5c.

DETAILED DESCRIPTION

Figure 1:
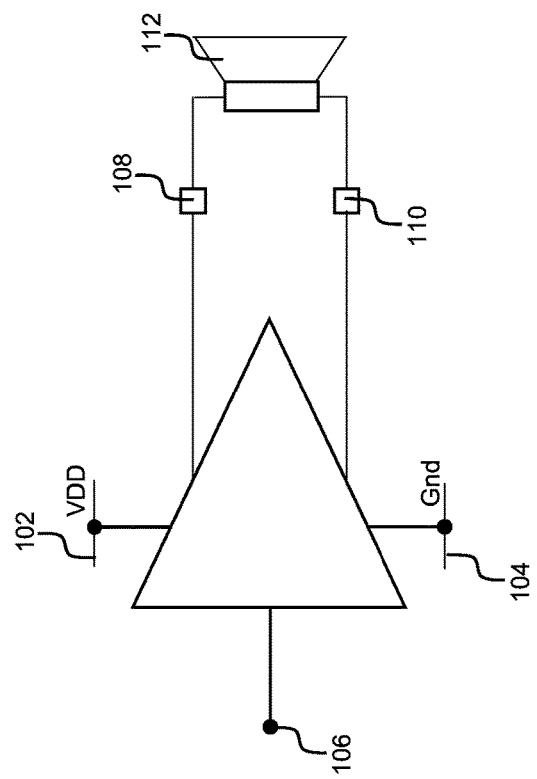
FIG. 1 is a schematic representation of amplifier circuitry outputting a differential output signal to an audio load.
Figure 1:
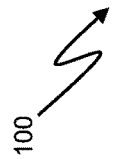

Referring first to FIG. 1, amplifier circuitry is shown generally at 100. The amplifier circuitry 100 is coupled to a positive supply voltage rail 102 so as to receive a positive supply voltage VDD (which may be, for example, 1.8 volts) and to reference voltage supply rail 104, which in this example is at ground or 0 volts. The amplifier circuitry further includes an input node 106 for receiving an input audio signal (which may be a digital audio signal or an analogue audio signal) to be amplified and first and second output nodes 108, 110 for outputting a differential audio signal to drive an audio load 112 such as an audio output transducer of a host audio device such as a headphone, earphone, earbud or the like that may be coupled between the first and second output nodes 108, 110.

Because the amplifier circuitry 100 receives its power supply from the positive and ground supply rails 102, 104, but outputs a differential output signal, the amplifier circuitry 100 must generate a common mode voltage signal VCM at a level intermediate the positive supply voltage VDD and 0 volts, and drive the output nodes 108, 110 above and below this common mode level. The common mode signal VCM can be generated in a number of ways that will be familiar to those skilled in the art. For example, a simple resistive voltage divider arrangement may be provided between the positive and ground supply rails 102, 104 to generate a common mode signal VCM at a suitable level. The common mode signal level is typically chosen to be at the mid-point between 0 volts and VDD (e.g. if VDD is 1.8 volts the common mode signal level may be 0.9 volts).

On start-up of the amplifier circuitry 100, a voltage at the first and second output nodes 108, 110 must transition from 0 volts to the common mode voltage VCM. Similarly, when the amplifier circuitry 100 shuts down, the voltage at the first and second output nodes 108, 110 transitions from the common mode voltage to 0 volts.

The first and second output nodes 108, 110 of the amplifier circuitry 100 will not regulate to the correct common mode voltage VCM until all of the internal nodes of the amplifier circuitry 100 have settled to their correct levels, and thus differential transient signals may arise between the first and second output nodes 108, 110, particularly during start-up and shut-down of the amplifier circuitry 100. Any such transients that appear across the audio load 112 can give rise to audible artefacts such as pops in the audio output of the audio load 112, which can negatively affect a user's experience of using a host audio device that incorporates the amplifier circuitry 100.

Further, in some applications it is desirable to power down the amplifier circuitry 100 when no input signal is present at the input node 106, e.g. when audio playback has been paused on a host device that incorporates the amplifier circuitry 100, in order to reduce the power consumption of the host device. In such situations it is desirable to hold the output nodes 108, 110 of the amplifier circuitry 100 at the common mode voltage level VCM while the amplifier circuitry 100 is powered down, in order to resume correct operation of the amplifier circuitry 100 when an input signal is again received at the input node 106, without any delay as the output nodes ramp up to the common mode voltage level VCM. Thus, by maintaining the output nodes 108, 110 at the common mode voltage level VCM while the amplifier circuitry 100 is powered down the amplifier circuitry 100 can quickly be re-enabled when an audio signal is again received at the input node 106.

Figure 2A:
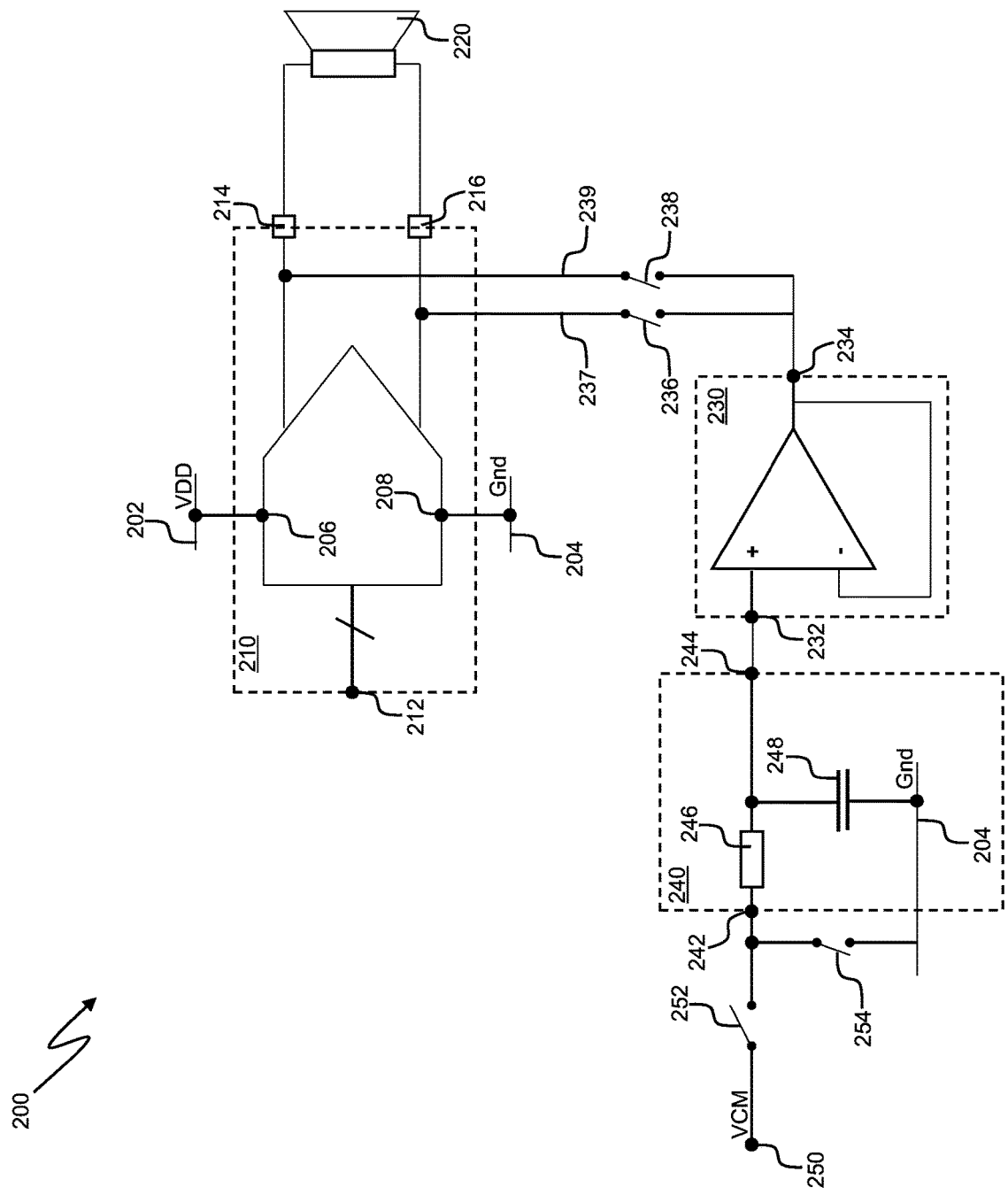
FIG. 2a is a schematic representation of circuitry that includes amplifier circuitry and auxiliary common mode buffer circuitry that is configured to selectively supply a common mode voltage VCM to output nodes of the amplifier circuitry.

FIG. 2a is a schematic representation of circuitry that includes amplifier circuitry and auxiliary common mode buffer circuitry that is configured to selectively supply a common mode voltage VCM to output nodes of the amplifier circuitry.

The circuitry, shown generally at 200 in FIG. 2, includes an amplifier unit 210 having an input node 212 for receiving an input audio signal to be amplified and first and second output nodes 214, 216 for outputting a differential output signal to drive an output audio load 220 which may be coupled between the first and second output nodes 212, 214. The audio output load 220 may be, for example, an audio output transducer of a host audio device such as a headphone, earphone, earbud and the like in which the circuitry 200 is incorporated.

The amplifier unit 210 in the illustrated example combines digital to analogue converter (DAC) and amplifier functionality, and thus may include DAC circuitry in addition to amplifier circuitry. Alternatively, the amplifier unit 210 may include combined amplifier and DAC circuitry. The amplifier unit 210 is thus represented in FIG. 2 as a DAC having differential outputs.

The amplifier unit 210 is configured to receive a digital audio input signal at the input node 212 and to output a differential analogue audio output signal at the first and second output nodes 214, 216, to drive the output audio load 220.

As shown in FIG. 2, the amplifier unit 210 is coupled to a positive supply voltage rail 202 so as to receive a positive supply voltage VDD at a first power supply input node 206. A second power supply input node 208 of the amplifier unit 210 is coupled to a reference voltage supply voltage rail 204, which in this example is at ground or 0 volts. As the amplifier unit 210 does not receive a negative power supply voltage, in order to generate a differential output signal the amplifier unit 210 receives or generates a common mode voltage signal VCM at a level intermediate 0 volts and VDD (e.g. VDD/2, which may be, for example, 0.9 volts, if VDD=1.8 Volts). The common mode voltage signal may be generated in a variety of ways which will be familiar to those of ordinary skill in the art, and thus for simplicity and clarity circuitry for generating the common mode voltage signal VCM is not shown in FIG. 2.

The circuitry 200 further includes a common mode buffer unit 230, which in this example is shown as comprising operational amplifier circuitry having a non-inverting input that is coupled to an input node 232 of the common mode buffer unit 230 and a feedback path that couples an output of the operational amplifier circuitry to an inverting input of the operational amplifier circuitry.

The circuitry 200 further includes a low pass filter unit 240. The low pass filter unit 240 has an input node 242 that is coupled to a common mode input node 250 of the circuitry 200 via a common mode enable switch 252, so as to receive the common mode voltage signal VCM when the common mode enable switch 252 is closed. The low pass filter unit 240 also includes an output node 244 that is coupled to the input node 232. In this example the low pass filter unit comprises a resistance 246 having a first terminal coupled to the input 242 and a second terminal coupled to the output node 244, and a capacitance 248 coupled between the second terminal of the resistance 246 and ground. A filter discharge switch 254 is coupled between the first terminal of the resistance 246 and the ground or 0 volt supply rail 204, and can be actuated on power down of the amplifier unit 210 to ensure that the common mode voltage signal VCM ramps smoothly down to ground or 0 volts, as will be discussed in more detail below.

An output node 234 of the common mode buffer unit 230 is coupled to the first and second output nodes 214, 216 of the amplifier unit 210 via respective first and second common mode signal paths 237, 239, which have respective first and second common mode clamp switches 236, 238, for selectively coupling the common mode voltage signal VCM to the first and second output nodes 214, 216 of the amplifier unit 210, as will now be described.

The circuitry 200 may be provided in an integrated circuit (IC), with the input node 212 being coupled to an input pin, pad or ball of the IC and the first and second output nodes 214, 216 being coupled to first and second output pins, pads or balls of the IC.

As discussed above in relation to FIG. 1, during start-up of the amplifier unit 210 the first and second output nodes 214, 216 will not regulate to the correct common mode voltage VCM until all of the internal nodes of the amplifier unit 210 have settled to their correct levels, and this may give rise to transient signals across the audio load 220 and thus to audible artefacts such as pops in the audio output of the audio load 220.

To mitigate this, on start-up of the amplifier unit 210 the common mode buffer unit 230 is enabled, and the common mode enable switch 252 and the first and second common mode clamp switches 236, 238 are closed, such that a voltage that develops at the output node 234 of the common mode buffer circuitry 230 also develops at both the first and the second output nodes 214, 216 of the amplifier unit 210 substantially simultaneously. By driving the first and second output nodes 214, 216 of the amplifier unit 210 with the signal output by the common mode buffer unit 230, differential transients across the audio load 220 as the first and second output nodes 214, 216 transition from 0 volts to the common mode voltage can be minimised.

Figure 2B:
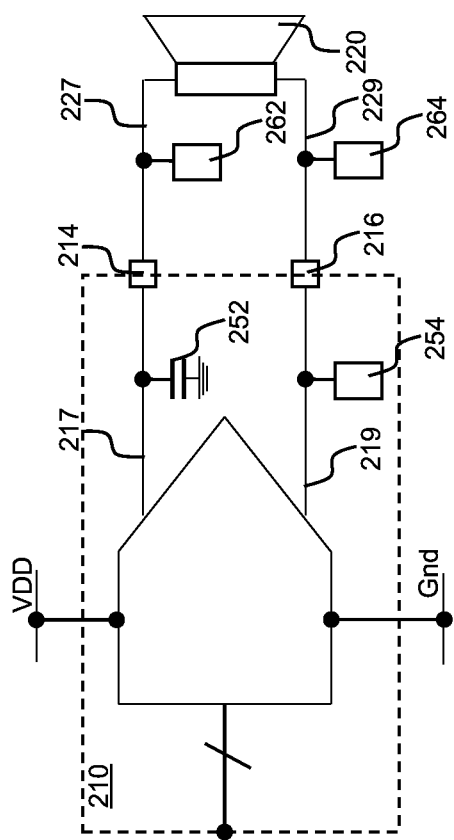

As will be appreciated, parasitic capacitances will be present in the circuitry 200, as shown schematically in FIG. 2b. Parasitic capacitances within an integrated circuit containing the circuitry 200 (e.g. parasitic capacitances 252, 254 associated with output signal paths 217, 219 to the first and second output nodes 214, 216 and/or parasitic capacitances associated with the common mode signal paths 237, 239 from the output node 234 of the common mode buffer circuitry 230 to the first and second output nodes 214, 216) are typically relatively small and can be controlled to a large extent in the design of the amplifier unit 210. Parasitic capacitances external to the circuitry 200 (e.g. parasitic capacitances external to an integrated circuit containing the circuitry 200), particularly parasitic capacitances 262, 264 associated with signal paths 227, 229 from the first and second output nodes 214, 216 of the amplifier circuitry to the output audio load 220 may be greater than those within the integrated circuit, and may be more difficult to control. Any mismatch between such parasitic capacitances 262, 264 associated with signal paths 227, 229 from the first and second output nodes 214, 216 of the amplifier circuitry to the output audio load 220 could give rise to transient voltages in the signals output to the first and second output nodes 214, 216 by the common mode buffer unit 230 and thus to differential transient voltages across the audio output load 220, which may cause audible artefacts such as pops in the audio signal output by the audio output load. The low pass filter unit 240 is provided to mitigate the effects of any such transients. By configuring the resistance and capacitance values of the resistance 246 and the capacitance 248, respectively, the low pass filter unit 240 can be configured to have a time constant that is greater than that of any transients that may arise due to parasitic capacitances in the circuitry 200, such that the effect of any such transients at the first and second output nodes 214, 216, and thus the effect of any such transients in the audio output of the audio load 220 can be minimised or at least reduced.

When the amplifier unit 210 is shut down or powered down, the voltage at the first and second output nodes 214, 216 transitions from the common mode voltage VCM to 0 volts. This transition can also give rise to differential transients across the audio load 220, which could manifest as audible artefacts such as pops in the audio signal output by the audio load 220.

To mitigate this, the common mode buffer unit 230 may again be enabled and the common mode enable switch 252 and the first and second common mode clamp switches 236, 238 may again be closed on shut-down of the amplifier unit 210 (or just before shut-down of the amplifier unit 210, to allow time for the voltage at the output of the common mode buffer unit to transition from 0 volts to the common mode voltage VCM). In this way the voltage at the first and second output nodes 214, 216 is maintained at the common mode voltage VCM as the amplifier unit 210 shuts down. Thus, there is substantially no voltage across the audio output load 220 during shut-down of the amplifier unit 210, and thus differential transients across the audio load 220 during shut-down of the amplifier unit 210 can be minimised or at least reduced.

Once the amplifier unit 210 has shut down, the common mode enable switch 252 can be opened, to decouple the low pass filter unit 240 from the common mode voltage VCM, and the filter discharge switch 254 can be closed. Thus the capacitor 248 discharges from VCM to ground through the resistance 246 and the voltage at the output node 234 of the common mode buffer unit 230 similarly transitions from VCM to 0 volts. The time constant of the low pass filter unit 240 (determined by the resistance and capacitance values of the resistance 246 and the capacitance 248, respectively) is greater than that of any transients that may arise due to mismatches in parasitic capacitances in the circuitry 200 (particularly in the common mode signal paths 237, 239 and/or in the signal paths 227, 229), as the voltage at the output node 234 of the common mode buffer unit 230 transitions from VCM to 0 volts. Accordingly the effect of any such transients at the first and second output nodes 214, 216, and thus the effect of any such transients in the audio output of the audio load 220, can be minimised or at least reduced.

As discussed above, it may be desirable to power down the amplifier unit 210 when no input signal is present at the input node 212 (which may be referred to as a "mute state"), e.g. when audio playback has been paused on a host device that incorporates the amplifier unit 210, in order to reduce the power consumption of the host device.

In order to resume correct operation of the amplifier unit 210 without audio artefacts when an input signal is again received at the input node 212, the common mode buffer 230 may be enabled and the common mode enable switch 252 and the first and second common mode clamp switches 236, 238 may be closed when the amplifier unit 210 is powered down (or just before the amplifier unit 210 is powered down, to allow time for the voltage at the output of the common mode buffer unit to transition from 0 volts to the common mode voltage VCM). The voltage at the first and second output nodes 214, 216 is thereby maintained at the common mode voltage VCM while the amplifier unit 210 is powered down. When the amplifier unit 210 is powered up again when an input signal is again received at the input node 212 normal operation can be resumed without any delay to allow the output nodes 214, 216 to transition from 0 volts to VCM.

The amplifier circuitry of the common mode buffer unit 230 can be relatively small and low power, because any noise in its output signal is common to both of the output nodes 214, 216 of the amplifier unit 210 and thus will not be present in the audio signal output by the audio load 220, and because the linearity of the amplifier circuitry of the common mode buffer unit 230 does not affect the performance of the amplifier unit 210.

Figure 3:
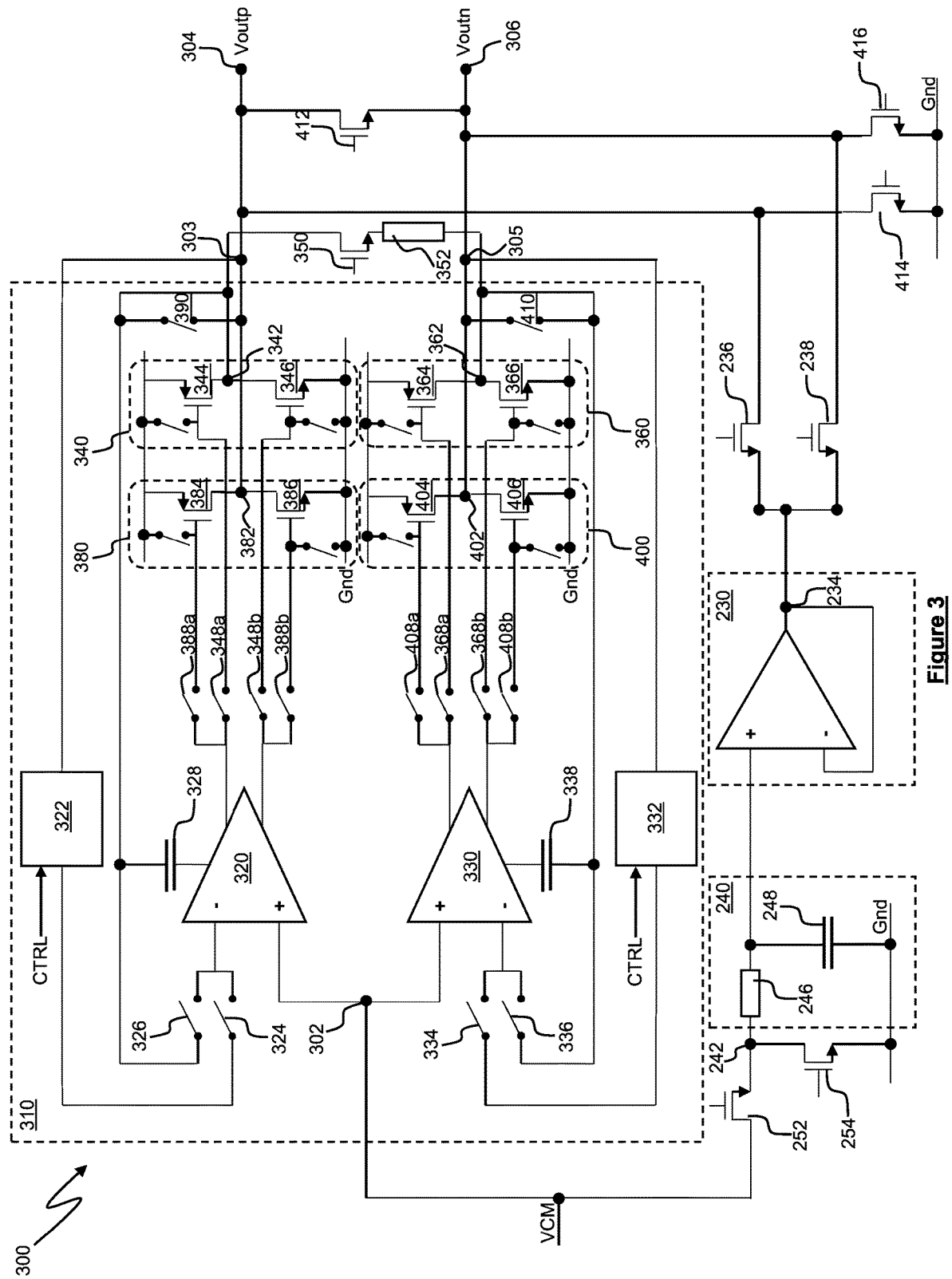
FIG. 3 is a schematic representation of an implementation of circuitry that includes amplifier circuitry and common mode buffer circuitry.

FIG. 3 is a schematic representation of an implementation of circuitry 300 that includes amplifier circuitry and common mode buffer circuitry.

The amplifier circuitry, shown generally at 310, implements a switched capacitor digital to analogue converter (DAC) that is regulated by first and second pseudo-differential amplifiers 320, 330. Non-inverting (+) inputs of the first and second pseudo-differential amplifiers 320, 330 are coupled together at a node 302, at which a common mode signal VCM is received.

In the example shown in FIG. 3 the amplifier circuitry 310 is configured as a unity gain amplifier or buffer, in order to provide sufficient power to drive a load (e.g. an audio output transducer) that is coupled to output nodes of the amplifier circuitry 310. However, as will be appreciated by those of ordinary skill in the art, the term "amplifier circuitry" can be used to refer to circuitry that outputs an output signal of reduced amplitude as compared to an input signal (i.e. attenuates the input signal), to circuitry that outputs an output signal having the same amplitude as an input signal (i.e. buffers the input signal) or to circuitry that that outputs an output signal of increased amplitude as compared to an input signal (i.e. amplifies the input signal). As will be appreciated by those of ordinary skill in the art, the principles described herein are applicable to amplifier circuitry of any of the above-described types.

A first real feedback path including a first switched capacitor digital to analogue converter (DAC) 322 is coupled between an inverting (−) input of the first differential amplifier 320 and a circuit node 303 that is coupled to a first output node 304 of the circuitry 300.

The first switched capacitor DAC 322 has an input for receiving a control signal CTRL representing an input digital audio signal to be amplified. Suitable switched capacitor DAC arrangements will be familiar to those of ordinary skill in the art, and thus the first switched capacitor DAC 322 will not be described in detail here.

A first real feedback path enable switch 324 is provided in the feedback path between the first switched capacitor DAC 322 and the inverting input of the first pseudo-differential amplifier 320. The first real feedback path enable switch 324 can be closed to enable the first real feedback path, or opened to disable the first real feedback path.

A second real feedback path including a second switched capacitor digital to analogue converter (DAC) 332 is coupled between an inverting (−) input of the second differential amplifier 330 and a circuit node 305 that is coupled to a first output node 306 of the circuitry 300.

The second switched capacitor DAC 332 has an input for receiving the control signal CTRL representing the input digital audio signal to be amplified. Again, suitable switched capacitor DAC arrangements will be familiar to those of ordinary skill in the art, and thus the second switched capacitor DAC 332 will not be described in detail here.

A second real feedback path enable switch 334 is provided in the feedback path between the second switched capacitor DAC 332 and the inverting input of the second pseudo-differential amplifier 330. The second real feedback path enable switch 334 can be closed to enable the second real feedback path, or opened to disable the second real feedback path.

A first dummy feedback path is coupled between the inverting input of the first differential amplifier 320 and an output node 342 of a first dummy output stage 340. First compensation capacitances (represented here as a single capacitance 328) are coupled between the first dummy feedback path and outputs of the first pseudo-differential amplifier 320. A first dummy feedback path enable switch 326 is provided in the first dummy feedback path between the output node 342 of the first dummy output stage and the inverting input of the first differential amplifier 320. The first dummy feedback path enable switch 326 can be closed to enable the first dummy feedback path, or opened to disable the first dummy feedback path.

A second dummy feedback path is coupled between the inverting input of the second differential amplifier 330 and an output node 362 of a second dummy output stage 360. Second compensation capacitances (represented here as a single capacitance 338) are coupled between the second dummy feedback path and outputs of the second pseudo-differential amplifier 330. A second dummy feedback path enable switch 336 is provided in the second dummy feedback path between the output node 362 of the second dummy output stage and the inverting input of the second differential amplifier 330. The second dummy feedback path enable switch 336 can be closed to enable the second dummy feedback path, or opened to disable the second dummy feedback path.

The first dummy output stage 340 comprises first and second transistors 344, 346 coupled in series between a positive supply rail and ground. In the illustrated example the first transistor 344 is a PMOS device and the second transistor 346 is an NMOS device, with the source terminal of the first transistor 344 being connected to the positive supply, the drain terminal of the first transistor 344 being connected to the drain terminal of the second transistor 346 and the source terminal of the second transistor 346 being connected to ground. A gate terminal of the first transistor 344 is coupled to a first output terminal of the first pseudo-differential amplifier 320 via a first dummy output stage selector switch 348a, and a gate terminal of the second transistor 346 is coupled to a second output terminal of the first pseudo-differential amplifier 320 via a second dummy output stage selector switch 348b. By closing the first and second dummy output stage selector switches 348a, 348b the first dummy output stage 340 can be coupled to the outputs of the first pseudo-differential amplifier 320.

Similarly, the second dummy output stage 360 comprises first and second transistors 364, 366 coupled in series between a positive supply rail and ground. In the illustrated example the first transistor 364 is a PMOS device and the second transistor 366 is an NMOS device, with the source terminal of the first transistor 364 being connected to the positive supply, the drain terminal of the first transistor 364 being connected to the drain terminal of the second transistor 366 and the source terminal of the second transistor 366 being connected to ground. A gate terminal of the first transistor 364 is coupled to a first output terminal of the second pseudo-differential amplifier 330 via a third dummy output stage selector switch 368a, and a gate terminal of the second transistor 366 is coupled to a second output terminal of the second pseudo-differential amplifier 330 via a fourth dummy output stage selector switch 368b. By closing the third and fourth dummy output stage selector switches 368a, 368b the second dummy output stage 360 can be coupled to the outputs of the second pseudo-differential amplifier 330.

The output nodes 342, 362 of the first and second dummy output stages 340, 360 are coupled to a dummy load, shown in FIG. 3 as a controllable switch device 350, which in the illustrated example is a NMOS device coupled in series with a resistance 352 that provides an appropriate load, as will be familiar to those of ordinary skill in the art. A drain terminal of the NMOS device is coupled to the output node 342 of the first dummy output stage 340 and a source terminal is coupled to the output node 362 of the second dummy output stage 360, via the resistance 352. A gate terminal of the non-ideal NMOS device 350 receives a control signal (not shown) to control its operation. As will be appreciated, when the NMOS device is switched on its on-resistance provides a load between the output nodes 342, 364 of the first and second dummy output stages 340, 360. In an alternative arrangement the dummy load could be provided by a non-ideal NMOS device having a suitable on-resistance coupled between the output nodes 342, 364 of the first and second dummy output stages 340, 360. In this arrangement the on-resistance of the non-ideal MOS device provides a load for the first and second dummy output stages 340, 360 when the controllable switching device is switched on.

The circuitry 300 further includes first and second real output stages 380, 400. The first and second real output stages 380, 400 are similar in structure to the first and second dummy output stages 340, 360.

Thus, the first real output stage 380 comprises a first (PMOS) transistor 384 and a second (NMOS) transistor 386 coupled in series between a positive supply rail and ground. A source terminal of the first transistor 384 is connected to the positive supply, a drain terminal of the first transistor 384 is connected to the drain terminal of the second transistor 386 and the source terminal of the second transistor 386 is connected to ground. A gate terminal of the first transistor 384 is coupled to the first output terminal of the first pseudo-differential amplifier 320 via a first real output stage selector switch 388a, and a gate terminal of the second transistor 386 is coupled to a second output terminal of the first pseudo-differential amplifier 320 via a second real output stage selector switch 388b. By closing the first and second real output stage selector switches 388a, 348b the first real output stage 380 can be coupled to the outputs of the first pseudo-differential amplifier 320. An output node 382 of the first real output stage 380 is coupled to the first output node 304 of the circuitry 300 so as to provide a first Voutp component of the differential output signal that develops between the first and second output nodes 304, 306.

A first dummy/real feedback path selector switch 390 is coupled between the output node 382 of the first real output stage 380 and the first compensation capacitance 328. By closing the first dummy/real feedback path selector switch 390 the first compensation capacitances 328 can be coupled to the output node 382 of the first real output stage 380. When the first dummy/real feedback path selector switch 390 is open the first compensation capacitances 328 can be coupled to the output node 342 of the first dummy output stage 340.

Similarly, the second real output stage 400 comprises a first (PMOS) transistor 404 and a second (NMOS) transistor 406 coupled in series between a positive supply rail and ground. A source terminal of the first transistor 404 is connected to the positive supply, the drain terminal of the first transistor 404 is connected to the drain terminal of the second transistor 406 and the source terminal of the second transistor 406 is connected to ground. A gate terminal of the first transistor 404 is coupled to a first output terminal of the second pseudo-differential amplifier 330 via a third real output stage selector switch 408a, and a gate terminal of the second transistor 408 is coupled to a second output terminal of the second pseudo-differential amplifier 330 via a fourth real output stage selector switch 408b. By closing the third and fourth real output stage selector switches 408a, 408b the second real output stage 400 can be coupled to the outputs of the second pseudo-differential amplifier 330. An output node 402 of the second real output stage 400 is coupled to the second output node 306 of the circuitry 300 so as to provide a second component Voutn of the differential output signal that develops between the first and second output nodes 304, 306.

A second dummy/real feedback path selector switch 410 is coupled between the output node 402 of the first real output stage 400 and the second compensation capacitance 338. By closing the second dummy/real feedback path selector switch 410 the second compensation capacitance 338 can be coupled to the output node 402 of the second real output stage 400. When the second dummy/real feedback path selector switch 410 is open the second compensation capacitances 338 can be coupled to the output node 362 of the second dummy output stage 360.

The circuitry 300 further includes a controllable low resistance (or the order of 1Ω) output clamp switch 412, which in this example is an NMOS switch, coupled between the first and second output nodes 304, 306 of the circuitry 300 and operable, in response to an appropriate control signal, to couple the first and second output nodes 304, 306 together so as to minimise differential transients between the first and second output nodes 304, 306.

The circuitry 300 further includes a common mode buffer unit 230, a low pass filter unit 240, a common mode enable switch 252 (shown in FIG. 3 as an NMOS device) and a filter discharge switch 254 (also shown in FIG. 3 as an NMOS device). These elements are similar to, and are coupled in a similar manner to, the corresponding elements of FIG. 2 described above, and thus will not be described in detail here.

An output node 234 of the common mode buffer unit 230 is coupled to the first and second output nodes 304, 306 of the circuitry 300 via respective first and second common mode clamp switches 236, 238 (shown in FIG. 3 as NMOS devices), so as to selectively couple a common mode voltage signal VCM to the first and second output nodes 304, 306 of the circuitry 300.

The circuitry 300 further includes first and second ground clamp switches 414, 416, which in this example are NMOS devices, coupled respectively to the first and second output nodes 304, 306 of the circuitry and configured to selectively couple the first and second output nodes 304, 306 of the circuitry 300 to ground.

Although FIG. 3 shows the amplifier unit 310 as comprising first and second pseudo-differential amplifiers 320, 330, it will be appreciated by those of ordinary skill in the art that amplifier unit 310 could also be implemented using a fully differential amplifier in place of the first and second pseudo-differential amplifiers 320, 330.

Figure 4:
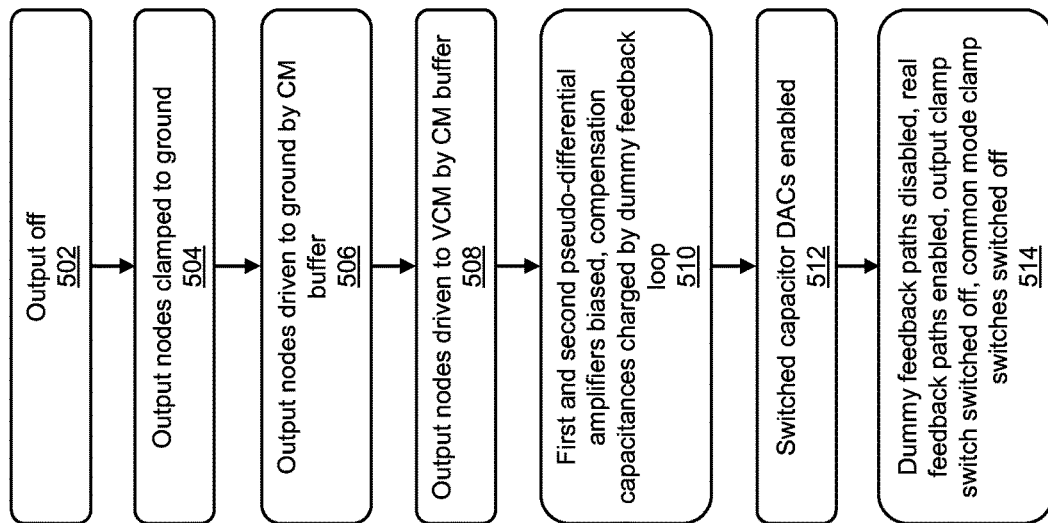
FIG. 4 is a flow diagram of a sequence of steps performed by the amplifier circuitry on start-up.

The operation of the circuitry 300 will now be explained with reference to FIG. 4, which is a flow diagram illustrating a sequence of operations that are performed on start-up of the circuitry 300 of FIG. 3.

Initially (step 502) the circuitry 300 is in an output off state, in which no output signal is present at the first and second output nodes 304, 306. In this initial state, the low resistance output clamp switch 412 is switched on, thereby coupling the first output node 304 to the second output node 306, so as to minimise any differential transients between the first output node 304 and the second output node 306. The controllable switch device 350 is switched on, to provide a suitable load for the first and second dummy output stages 340, 360. The first and second dummy feedback path enable switches 326, 336 are switched on, to enable the first and second dummy feedback paths respectively, and the first and second real feedback path enable switches 324, 334 are opened, to disable the first and second feedback paths respectively.

At step 504 the first and second output nodes 304, 306 are clamped to ground, by switching on the first and second ground clamp switches 414, 416.

The common mode buffer unit 230 is enabled and the filter discharge switch 254 is switched on, thereby coupling the input of the common mode buffer unit 230 to ground. The first and second common mode clamp switches 236, 238 are switched on, such that the first and second output nodes 304, 306 are driven to ground by the common mode buffer unit 230 (step 506).

The first and second ground clamp switches 414, 416 and the filter discharge switch 254 are then switched off and the common mode enable switch 252 is switched on, such that the common mode buffer unit 230 receives the common mode voltage VCM (via the low pass filter unit 240). The output of the common mode buffer unit 230 (which is coupled to the first and second output nodes 304, 306 by the first and second common mode clamp switches 236, 238, which are still switched on) rises to VCM, and thus the first and second output nodes 304, 306 also ramp up to VCM (step 508).

At step 510 the first and second pseudo-differential amplifiers 320, 330 are biased to their normal operating levels and the first and second compensation capacitances 328, 338 are charged to their operating voltages by the dummy feedback loop. Charging the compensation capacitances in this way helps to avoid transients when the real output stages 380, 400 are enabled once the output nodes 304, 306 have been brought up to the common mode voltage VCM by the common mode buffer circuitry 230.

Once the first and second pseudo-differential amplifiers 320, 330 have been correctly biased and the first and second compensation capacitances 328, 338 have been charged, the first and second switched capacitor DACs 322, 332 can be enabled (step 512).

The first and second dummy feedback paths are disabled by switching off (i.e. opening) the first and second dummy feedback path enable switches 326, 336. The controllable switching device 350 is also switched off (opened) to decouple the dummy load from the first and second dummy output stages. At the same time, the first and second real feedback path enable switches 324, 334 are switched on (closed), to enable the first and second real feedback paths respectively, and the first and second dummy/real feedback path selector switches 390, 410 are switched on (closed) to ensure that the compensation capacitances 328, 338 continue to be charged by the real output stages 380, 400.

The low resistance output clamp switch 412 is switched off (opened), thereby decoupling the first output node 304 from the second output node 306, and the first and second common mode clamp switches 236, 238 are switched off (opened), to decouple the common mode buffer unit 230 from the output nodes 304, 306.

The sequence described above ensures that the output nodes 304, 306 are biased to the common mode VCM and that the pseudo-differential amplifiers 320, 330 are correctly biased before the real output stages 380, 400 are enabled, thus reducing the likelihood of audible artefacts such as pops being present in the audio signal output by an audio output transducer that is coupled between the first and second output nodes 304, 306.

As will be appreciated by those of ordinary skill in the art, there will inherently be some DC offset in the amplifier unit 310 due to component mismatches, e.g. component mismatches in the switched capacitor DACs 322, 332. Such DC offset can be pre-compensated (i.e. compensated for prior to use of the amplifier unit 310 or the circuitry 300) during production testing, in a manner that will be familiar to those of ordinary skill in the art.

The circuitry 310 continues to operate in its normal operating mode until either the circuitry 310 needs to shut down (e.g. because a host device incorporating the circuitry 310 is being switched off or disconnected from an audio source), or audio output needs to be paused, e.g. because no audio input is present at the control inputs of the first and second switched capacitor DACs 322, 332.

As explained above, it is desirable to avoid or minimise the presence of audible artefacts such as pops in the audio signal output by an audio output transducer coupled between the first and second output nodes 304, 306 when the circuitry 300 shuts down. Thus, on shut down of the circuitry 310, a sequence that is essentially the reverse of that described above and illustrated in FIG. 4 is followed.

Thus, on shut down of the circuitry 310, the first and second common mode clamp switches 236, 238 are switched on (closed), to couple the common mode buffer unit 230 to the output nodes 304, 306 such that the common mode voltage VCM appears at the first and second output nodes 304, 306. The low resistance output clamp switch 412 is switched on (closed) to couple the first output node 304 to the second output node 306 so as to minimise any differential transients between the first and second output nodes 304, 306 as the circuitry shuts down.

The first and second real feedback path enable switches 324, 334 are switched off (opened), to disable the first and second feedback paths respectively, and the first and second dummy feedback paths are enabled by switching on (i.e. opening) the first and second dummy feedback path enable switches 326, 336 and switching off (opening) the controllable switch device 350 to decouple the output nodes 342, 362 of the first and second dummy output stages 340, 360 from each other.

The first and second switched capacitor DACs 322, 332 are disabled, and the first and second pseudo-differential amplifiers 320, 330 can then also be disabled.

The common mode enable switch 252 is then switched off (opened) and the filter discharge switch 254 is switched on (closed). This causes the output of the common mode buffer unit 230 to ramp down to 0 volts (over a time period that is determined by the values of the resistance 246 and the capacitance 248), thus driving the output nodes 304, 306 to ground. Once the voltage at the output nodes 304, 306 has reached 0 volts, the first and second ground clamp switches 414, 416 can be switched on (closed) to clamp the first and second output nodes to ground, and the first and second common mode clamp switches 236, 238 can be switched off (opened).

As discussed above, it may be desirable to power down the circuitry 310 in a mute state (also referred to as an enhanced dynamic range extension or EDRE state) when no input signal is present at the control inputs of the first and second switched capacitor DACs 322, 332, e.g. when audio playback has been paused on a host device that incorporates the circuitry 310, in order to reduce the power consumption of the host device.

When the circuitry 310 enters the mute state it should be able to revert to normal operation quickly without having to bring the output nodes up to the common mode voltage VCM when an input signal returns to the control inputs of the first and second switched capacitor DACs 322, 332.

Thus, when the circuitry 310 enters the mute state, the sequence described above is partially followed. As will be apparent from the following discussion, the process performed when the circuitry 310 enters the mute state omits steps 504 and 506 of the sequence described above, but performs steps 508. Steps 512 and 514 are performed when reverting to an active state (i.e. normal operation) of the circuitry 310 from the mute state.

When the circuitry 310 enters the mute state, the real output stages 380, 400 and the real feedback paths are disabled, thereby decoupling the real output stages 380, 400 from the output nodes 304, 306.

However, instead of driving the output nodes 304, 306 to 0 volts and clamping them to ground by switching on the first and second ground clamp switches 414, 416 (as in steps 504 and 506 of the sequence described above), the output nodes 304, 306 are held at the common mode voltage VCM by switching on the first and second common mode clamp switches 236, 238 and the common mode enable switch 252 (i.e. step 508 is performed). The low resistance output clamp switch 412 may also be switched on, to minimise differential transients between the first and second output nodes 304, 306.

When an input signal is again received at the control inputs of the first and second switched capacitor DACs 322, 332 normal operation of the circuitry 310 can be resumed by re-enabling the real output stages 380, 400 and the real feedback paths and associated switched capacitor DACs 322, 332, and switching off the first and second common mode clamp switches 236, 238 and the low resistance output clamp switch 412 (i.e. by performing steps 512 and 514 of the sequence described above).

As will be apparent from the discussion above, the circuitry of the present disclosure provides a mechanism to minimise or at least reduce audible artefacts in an audio signal output by an audio output transducer during start up or shut down of amplifier circuitry that drives the audio output transducer.

The discussion above relates to the use of auxiliary common mode buffer circuitry to output a common mode signal to output nodes or output signal paths of a differential or pseudo-differential amplifier arrangement. However, the principles described above are applicable more generally to signal processing circuitry having output signal paths for outputting a differential output signal, as will now be described with reference to FIGS. 5a-5f.

FIG. 5a is a schematic representation of circuitry 600 comprising first signal processing circuitry 610 having first and second output signal paths 612, 614 coupled to first and second nodes 616, 618 for outputting a differential output signal to a load 620. The first signal processing circuitry may be amplifier or buffer circuitry, DAC circuitry or the like. The circuitry 600 further comprises second circuitry 630 that is configured to output a common mode voltage to the first and second output signal paths 612, 614, via first and second common mode signal paths 632, 632 that are coupled, respectively, to the first and second output signal paths 612, 614 of the first signal processing circuitry 610. The second circuitry may be signal processing circuitry, e.g. amplifier or buffer circuitry or the like. By outputting the common mode voltage to the first and second output signal paths 612, 164 a differential voltage across the load 620 can be minimised or at least reduced, as described above with reference to FIGS. 2a and 3.

Figure 5B:
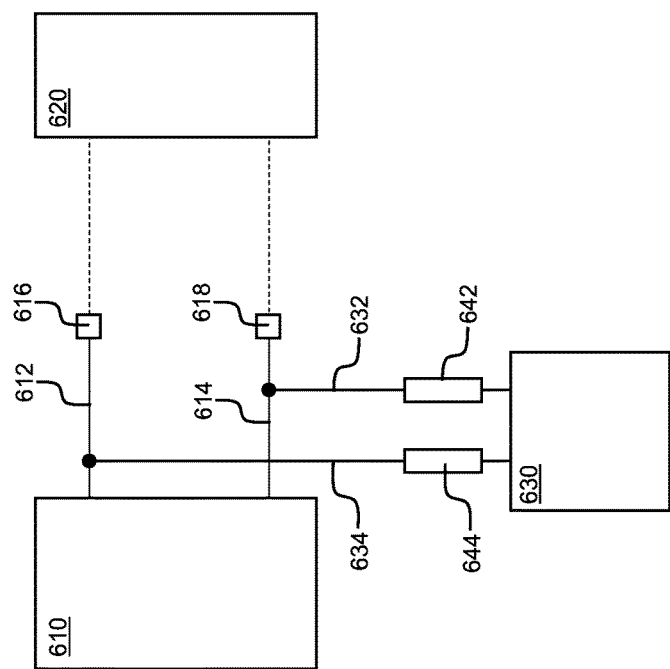

FIG. 5b is a schematic representation of alternative circuitry 700. Elements common to the circuitry 800 of FIG. 5b and the circuitry 600, 700 of FIGS. 5a and 5b are denoted by common reference numerals. The circuitry 700 is similar to the circuitry 600, with the exception that the circuitry 700 includes fixed or variable first and second resistances 642, 644 in the first and second common mode signal paths 632, 634. The first and second resistances 642, 644 are selected so as to have minimal adverse effect on the load 620, and thus will typically be larger than the resistance of the load 620. For example, for a load having a resistance of the order of 100Ω, the first and second resistances 642, 644 may be of the order of 10 kΩ. As will be appreciated by those of ordinary skill in the art, parasitic capacitances associated with the first and second common mode signal paths 632, 634, in combination with the first and second resistances 642, 644, will give rise to a time period over which the voltage at the first and second output signal paths 612, 614 will ramp up the common mode voltage output by the second circuitry 630, and this time period will be dependent in part upon the values of the first and second resistances 642, 644. Thus, as will be appreciated by those of ordinary skill in the art, the selection of the values of the first and second resistances 642, 644 will be a compromise between minimising the effect of the first and second resistances 642, 644 on the load 620 and providing a suitable time period over which the voltage at the first and second output signal paths 612, 614 will ramp up to the common mode voltage.

FIG. 5c is a schematic representation of alternative circuitry 800. Elements common to the circuitry 800 of FIG. 5c and the circuitry 600 of FIG. 5a are denoted by common reference numerals. The circuitry 700 is similar to the circuitry 600, with the exception that the circuitry 800 includes selector circuitry 660 for selectively coupling the output of the second circuitry 630 to the first and second output signal paths 612, 614.

The selector circuitry 660 may comprise, for example, first and second controllable switch devices coupled, respectively, between the output of the second circuitry 630 and the first and second common mode signal paths 632, 634, for selectively coupling the output of the second circuitry to the first and second common mode signal paths 632, 634 (and hence to first and second output signal paths 612, 614), as shown in FIG. 5d.

Alternatively, the selector circuitry 660 may comprise, for example, first and second transistor devices coupled, respectively, between the output of the second circuitry 630 and the first and second common mode signal paths 632, 634, for selectively coupling the output of the second circuitry to the first and second common mode signal paths 632, 634 (and hence to first and second output signal paths 612, 614), as shown in FIG. 5e.

Alternatively, the selector circuitry 660 may comprise, for example, first and second fixed or variable resistances coupled, respectively, between the output of the second circuitry 630 and the first and second common mode signal paths 632, 634, as shown in FIG. 5f.

In the examples illustrated in FIGS. 5c-5f the selector circuitry 660 enables the common mode voltage to be selectively coupled to the first and second output signal paths 612, 614 of the first signal processing circuitry 610, such that when the common mode voltage is coupled to the first and second output signal paths 612, 614 of the first signal processing circuitry 610 a differential voltage across the load is minimised.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A circuitry comprising:
    audio amplifier circuitry for receiving an audio signal to be amplified; and
    first and second output nodes for outputting first and second differential output signals, wherein the circuitry further comprises:
    common mode buffer circuitry; and
    low pass filter circuitry;
    wherein the low pass filter circuitry has an input that is configured to receive a common mode voltage and an output coupled to an input of the common mode buffer circuitry and the common mode buffer circuitry is configured to selectively output a common mode signal to the first and second nodes; and
    wherein the circuitry further comprises a low pass filter discharge switch coupled in parallel with a capacitance of the low pass filter circuitry, the low pass filter discharge switch being operable to discharge the capacitance.

2. The circuitry according to claim 1, wherein the audio amplifier circuitry further comprises first and second power supply input nodes for receiving a positive power supply voltage and a reference power supply voltage.

3. The circuitry according to claim 1, further comprising digital to analogue converter (DAC) circuitry.

4. The circuitry according to claim 3, wherein the audio amplifier circuitry comprises combined amplifier and DAC circuitry.

5. The circuitry according to claim 1, further comprising first and second common mode clamp switches coupled between an output of the common mode buffer unit and the first and second output nodes respectively, to selectively couple the first and second output nodes to the output of the common mode buffer.

6. The circuitry according to claim 1, further comprising first and second clamp switches coupled to the first and second output nodes respectively, to selectively couple the first and second output nodes to a reference voltage.

7. The circuitry according to claim 1, further comprising an output clamp switch coupled to the first and second output nodes, to selectively couple the first and second output nodes to each other.

8. The circuitry according to claim 1, wherein the amplifier circuitry comprises:
    a dummy output stage;
    a dummy feedback path for selectively coupling an output of the dummy output stage to an input of the amplifier unit;
    a real output stage; and
    a real feedback path for selectively coupling an output of the real output stage to the input of the amplifier unit.

9. The circuitry according to claim 8, wherein the dummy feedback path is configured to couple the output of the dummy output stage to the input of the amplifier unit during start-up of the amplifier unit to bias the amplifier unit.

10. The circuitry according to claim 8, further comprising digital to analogue converter (DAC) circuitry, wherein the real feedback path comprises a switched capacitor network.

11. The circuitry according to claim 8, wherein the amplifier circuitry comprises differential amplifier circuitry or wherein the amplifier circuitry comprises first and second pseudo-differential amplifiers.

12. The circuitry according to claim 11, wherein the dummy feedback path is configured to couple the output of the dummy output stage to the input of the amplifier unit during start-up of the amplifier unit to bias the amplifier unit, the circuitry comprising:
    a first dummy output stage that is selectively couplable to first and second differential outputs of the first pseudo-differential amplifier;
    a first real output stage that is selectively couplable to the first and second differential outputs of the first pseudo-differential amplifier;
    a first dummy feedback path for selectively coupling an output of the first dummy output stage to an input of the first pseudo-differential amplifier;
    a first real feedback path for selectively coupling an output of the first real output stage to an input of the first pseudo-differential amplifier;
    a second dummy output stage that is selectively couplable to first and second differential outputs of the second pseudo-differential amplifier;
    a second real output stage that is selectively couplable to the first and second differential outputs of the second pseudo-differential amplifier;
    a second dummy feedback path for selectively coupling an output of the second dummy output stage to an input of the second pseudo-differential amplifier; and
    a second real feedback path for selectively coupling an output of the second real output stage to an input of the second pseudo-differential amplifier.

13. The circuitry according to claim 12 further comprising:
    a first compensation capacitance coupled to the first pseudo-differential amplifier, wherein the first compensation capacitance is selectively couplable to the first dummy feedback path or to the first real feedback path; and
    a second compensation capacitance coupled to the second pseudo-differential amplifier, wherein the second compensation capacitance is selectively couplable to the second dummy feedback path or to the second real feedback path.

14. The circuitry according to claim 12, wherein the circuitry is configured such that during start-up or shut-down of the amplifier circuitry:
the first dummy output stage is coupled to the first and second differential outputs of the first pseudo-differential amplifier;
the first dummy feedback path couples the output of the first dummy output stage to the input of the first pseudo-differential amplifier so as to bias the first pseudo-differential amplifier;
the second dummy output stage is coupled to the first and second differential outputs of the second pseudo-differential amplifier;
the second dummy feedback path couples the output of the second dummy output stage to the input of the second differential amplifier so as to bias the second pseudo-differential amplifier; and
an output of the common mode buffer circuitry is coupled to the first and second output nodes such that the first and second output nodes receive the common mode voltage; and/or
wherein the circuitry is configured such that during normal operation of the amplifier circuitry:
the first real output stage is coupled to the first and second differential outputs of the first pseudo-differential amplifier;
the first real feedback path couples the output of the first real output stage to the input of the first pseudo-differential amplifier;
the second real output stage is coupled to the first and second differential outputs of the second pseudo-differential amplifier;
the second real feedback path couples the output of the second real output stage to the input of the second pseudo-differential amplifier; and
an output of the common mode buffer circuitry is decoupled from the first and second output nodes; and/or
wherein the circuitry is configured such that during a mute state in which no input signal is present at the input node, an output of the common mode buffer circuitry is coupled to the first and second output nodes such that the first and second output nodes receive the common mode voltage.

15. An amplifier circuitry for receiving a signal to be amplified, the amplifier circuitry comprising:
first and second output nodes for outputting first and second differential output signals;
a dummy output stage;
a dummy load configured to provide a resistive load to the dummy output stage;
a dummy feedback path for selectively coupling an output of the dummy output stage to an input of the amplifier circuitry;
a real output stage configured to drive an output transducer; and
a real feedback path for selectively coupling an output of the real output stage to the input of the amplifier circuitry.

16. A circuitry comprising:
first signal processing circuitry comprising first and second output signal paths for outputting a differential output signal;
second circuitry configured to output a common mode signal to said first and second output signal paths;
low pass filter circuitry having an output coupled to an input of the second circuitry to supply a common mode voltage to the second circuitry; and
a low pass filter discharge switch coupled in parallel with a capacitance of the low pass filter circuitry, the low pass filter discharge switch being operable to discharge the capacitance.

17. An integrated circuitry comprising the circuitry of claim 1.

18. A device comprising the circuitry of claim 1, wherein the device comprises a mobile telephone, a tablet or laptop computer, a smart speaker, an accessory device, headphones, earphones or earbuds.

19. The circuitry according to claim 1, wherein the low pass filter circuitry has a time constant greater than a time constant of a transient signal that may arise due to parasitic capacitances in the circuitry.

20. A circuitry comprising:
audio amplifier circuitry for receiving an audio signal to be amplified; and
first and second output nodes for outputting first and second differential output signals, wherein the circuitry further comprises:
common mode buffer circuitry; and
low pass filter circuitry;
wherein the low pass filter circuitry has an input that is configured to receive a common mode voltage and an output coupled to an input of the common mode buffer circuitry and the common mode buffer circuitry is configured to selectively output a common mode signal to the first and second output nodes; and
wherein the circuitry further comprises first and second clamp switches coupled to the first and second output nodes respectively, to selectively couple the first and second output nodes to a reference voltage.

21. A circuitry comprising:
audio amplifier circuitry for receiving an audio signal to be amplified; and
first and second output nodes for outputting first and second differential output signals, wherein the circuitry further comprises:
common mode buffer circuitry; and
low pass filter circuitry;
wherein the low pass filter circuitry has an input that is configured to receive a common mode voltage and an output coupled to an input of the common mode buffer circuitry and the common mode buffer circuitry is configured to selectively output a common mode signal to the first and second output nodes; and
wherein the circuitry further comprises an output clamp switch coupled to the first and second output nodes, to selectively couple the first and second output nodes to each other.

22. A circuitry comprising:
audio amplifier circuitry for receiving an audio signal to be amplified; and
first and second output nodes for outputting first and second differential output signals, wherein the circuitry further comprises:
common mode buffer circuitry; and
low pass filter circuitry;
wherein the low pass filter circuitry has an input that is configured to receive a common mode voltage and an output coupled to an input of the common mode buffer circuitry and the common mode buffer circuitry is configured to selectively output a common mode signal to the first and second output nodes; and wherein the amplifier circuitry comprises:
- a dummy output stage;
- a dummy feedback path for selectively coupling an output of the dummy output stage to an input of the amplifier unit;
- a real output stage; and
- a real feedback path for selectively coupling an output of the real output stage to the input of the amplifier unit.

* * * * *